US012593450B2

(12) United States Patent　　　　(10) Patent No.:　US 12,593,450 B2

Huang　　　　　　　　　　　　　　(45) Date of Patent:　　Mar. 31, 2026

(54) SEMICONDUCTOR STRUCTURE WITH ENHANCES STRENGTH AND MANUFACTURING METHOD THEREOF

(71) Applicant: MACRONIX International Co., Ltd., Hsinchu (TW)

(72) Inventor: Chia-Tze Huang, Hsing-Chu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 405 days.

(21) Appl. No.: 18/182,385

(22) Filed: Mar. 13, 2023

(65) Prior Publication Data

US 2024/0315020 A1　　Sep. 19, 2024

(51) Int. Cl.
H10B 43/27　　　　　(2023.01)

(52) U.S. Cl.
CPC ................................... H10B 43/27 (2023.02)

(58) Field of Classification Search
CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | |
|---|---|---|---|
| 2009/0321816 A1* | 12/2009 | Son | H10B 41/20 |
| | | | 257/326 |
| 2016/0071876 A1* | 3/2016 | Mizuno | G11C 16/26 |
| | | | 438/269 |
| 2019/0115362 A1* | 4/2019 | Choi | H10B 43/27 |
| 2022/0384479 A1* | 12/2022 | Song | H10B 43/10 |
| 2025/0275136 A1* | 8/2025 | Park | H10B 43/27 |

FOREIGN PATENT DOCUMENTS

| | | |
|---|---|---|
| CN | 115394782 | 11/2022 |
| TW | 202114147 | 4/2021 |

OTHER PUBLICATIONS

"Office Action of Taiwan Counterpart Application", issued on Sep. 5, 2023, pp. 1-7.

* cited by examiner

*Primary Examiner* — William B Partridge
*Assistant Examiner* — Gustavo G Ramallo
(74) *Attorney, Agent, or Firm* — J.C. PATENTS

(57)　　　　　　　ABSTRACT

A semiconductor structure including a substrate, a stacked structure, a support pillar, and a channel pillar is provided. The substrate includes a peripheral region and an array region. The stacked structure is located on the substrate. The support pillar is located in the peripheral region. The support pillar passes through the stacked structure. The channel pillar is located in the array region. The channel pillar passes through the stacked structure. A thickness of the support pillar is greater than a thickness of the channel pillar.

19 Claims, 12 Drawing Sheets

SEMICONDUCTOR STRUCTURE WITH ENHANCES STRENGTH AND MANUFACTURING METHOD THEREOF

BACKGROUND

Technical Field

The disclosure relates to a semiconductor structure and a manufacturing method thereof; more particularly, the disclosure relates to a semiconductor structure having a support pillar and a manufacturing method of the semiconductor structure.

Description of Related Art

In some semiconductor structures, a sacrificial layer in a stacked structure is replaced by other material layers (e.g., conductive layers). In the replacement process described above, the sacrificial layer in the stacked structure is removed. However, the removal of the sacrificial layer in the stacked structure may weaken the structural strength and thus result in the collapse of the stacked structure. As a result, the manufacturing process of the semiconductor structure may not be performed smoothly.

SUMMARY

The disclosure relates to a semiconductor structure and a manufacturing method thereof, which are conducive to enhancing structural strength and ensuring the smooth manufacturing of the semiconductor structure.

An embodiment of the disclosure provides a semiconductor structure that includes a substrate, a stacked structure, a support pillar, and a channel pillar. The substrate includes a peripheral region and an array region. The stacked structure is located on the substrate. The support pillar is located in the peripheral region and passes through the stacked structure. The channel pillar is located in the array region and passes through the stacked structure. A thickness of the support pillar is greater than a thickness of the channel pillar.

According to an embodiment of the disclosure, in the semiconductor structure, the thickness of the support pillar is 8 times to 15 times the thickness of the channel pillar.

According to an embodiment of the disclosure, in the semiconductor structure, a cross-sectional shape of the stacked structure located in the peripheral region includes a staircase shape.

According to an embodiment of the disclosure, in the semiconductor structure, a material of the support pillar includes doped polysilicon, silicon nitride, or undoped polysilicon.

According to an embodiment of the disclosure, in the semiconductor structure, the support pillar has an opening passing through the support pillar.

According to an embodiment of the disclosure, the semiconductor structure further includes a filling layer that fills the opening.

According to an embodiment of the disclosure, in the semiconductor structure, a material of the filling layer does not include nitride.

According to an embodiment of the disclosure, in the semiconductor structure, the filling layer includes a single-layered structure.

According to an embodiment of the disclosure, in the semiconductor structure, the filling layer includes a multi-layered structure.

According to an embodiment of the disclosure, in the semiconductor structure, a portion of the filling layer located in the opening has a void.

According to an embodiment of the disclosure, the semiconductor structure further includes a dielectric layer and a stop layer. The dielectric layer is located between the stacked structure and the substrate. The stop layer is located in the dielectric layer.

According to an embodiment of the disclosure, in the semiconductor structure, the opening passes through the stop layer.

According to an embodiment of the disclosure, in the semiconductor structure, the opening extends into the stop layer but does not pass through the stop layer.

According to an embodiment of the disclosure, in the semiconductor structure, the stacked structure includes alternately stacked dielectric layers and conductive layers. The semiconductor structure further includes charge storage structures, a first conductive pillar, and a second conductive pillar. Each of the charge storage structures is located between a corresponding conductive layer of the conductive layers and the channel pillar. The first conductive pillar and the second conductive pillar are located in the channel pillar and separated from each other.

Another embodiment of the disclosure provides a manufacturing method of a semiconductor structure, and the manufacturing method includes following steps. A substrate is provided, and the substrate includes a peripheral region and an array region. A stacked structure is formed on the substrate. A support pillar is formed in the peripheral region, and the support pillar passes through the stacked structure. A channel pillar is formed in the array region, and the channel pillar passes through the stacked structure. A thickness of the support pillar is greater than a thickness of the channel pillar.

According to another embodiment of the disclosure, in the manufacturing method, the support pillar has an opening passing through the support pillar.

According to another embodiment of the disclosure, the manufacturing method further includes a step of forming a filling layer that fills the opening.

According to another embodiment of the disclosure, in the manufacturing method, a material of the filling layer does not include nitride.

According to another embodiment of the disclosure, in the manufacturing method, the stacked structure includes alternately stacked dielectric layers and conductive layers, and the manufacturing method further includes following steps. Charge storage structures are formed, and each of the charge storage structures is located between a corresponding conductive layer of the conductive layers and the channel pillar. A first conductive pillar and a second conductive pillar are formed, and the first conductive pillar and the second conductive pillar are located in the channel pillar and separated from each other.

According to another embodiment of the disclosure, in the manufacturing method, the support pillar, the first conductive pillar, and the second conductive pillar are simultaneously formed by the same manufacturing process.

In light of the foregoing, in the semiconductor structure and the manufacturing method thereof provided in one or more embodiments of the disclosure, the semiconductor structure has the support pillar, and the thickness of the support pillar is greater than the channel pillar. Hence, the support pillar may serve to enhance the structural strength, which allows the manufacturing process of the semiconductor structure to be smoothly performed. Besides, owing to the support pillar of the semiconductor structure, a subsequent etching process of forming an opening for accommodating a through-array via (TAV) may be performed in a self-aligned manner.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure FIG. 1A to FIG. IF are cross-sectional views of a manufacturing process of a semiconductor structure according to some embodiments of the disclosure.

DESCRIPTION OF THE EMBODIMENTS

The embodiments are described in detail below with reference to the accompanying drawings but are not intended to limit the scope provided in the disclosure. For the sake of easy understanding, the same components in the following description will be denoted by the same reference numbers and signs. In addition, the drawings are for illustrative purposes only and are not drawn to the original dimensions. As a matter of fact, for clear descriptions, the dimension of respective features may be arbitrarily enlarged or reduced.

FIG. 1A to FIG. 1F are cross-sectional views of a manufacturing process of a semiconductor structure according to some embodiments of the disclosure.

Figure 1A:
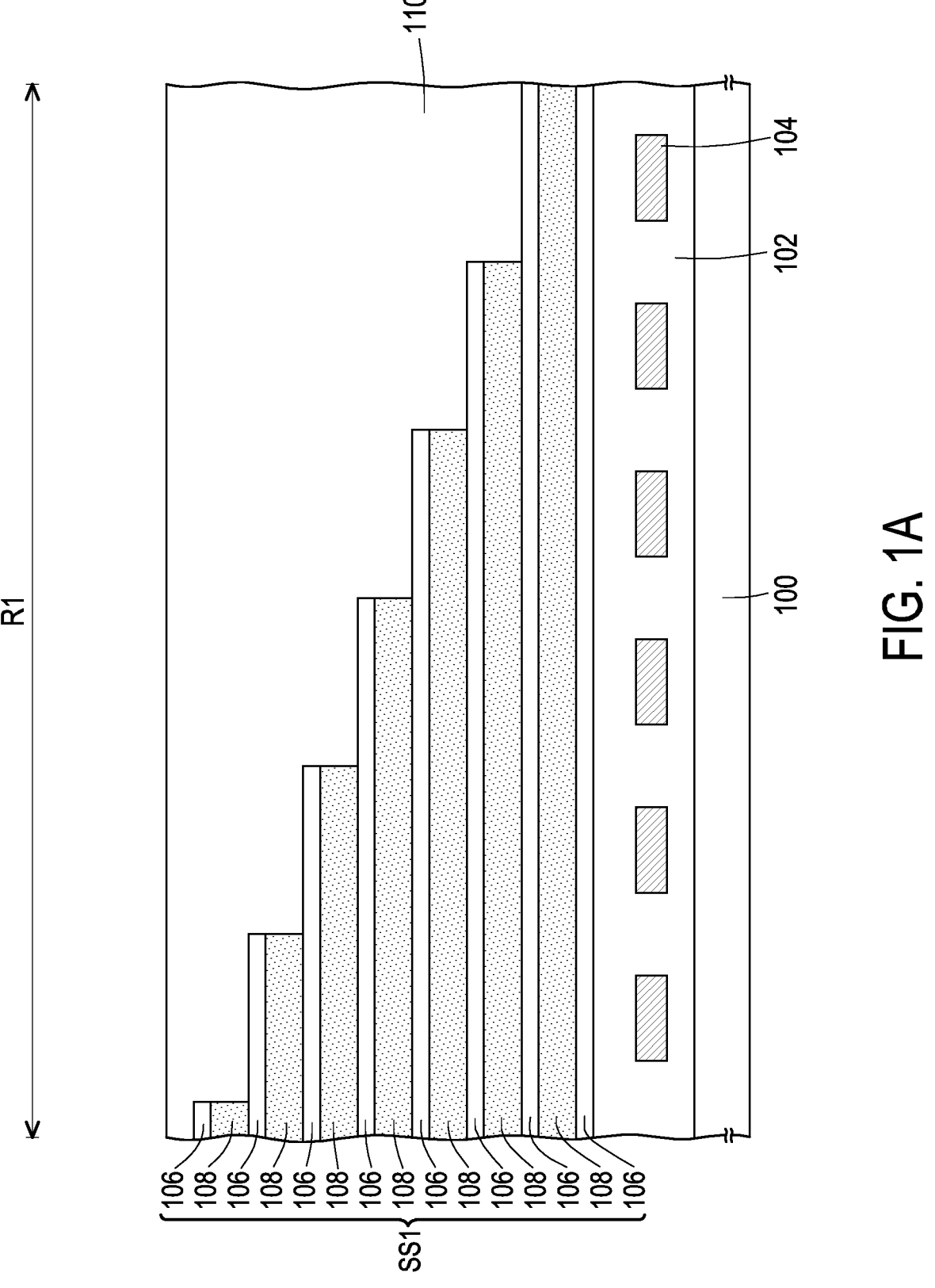

With reference to FIG. 1A, a substrate 100 is provided. The substrate 100 includes a peripheral region R1. The substrate 100 may be a semiconductor substrate, e.g., a silicon substrate. In addition, although not shown in the drawings, required components (e.g., a doped region, a transistor device, a dielectric layer, and/or an interconnection structure, etc.) may be disposed in or on the substrate 100, and the relevant description is omitted hereinafter.

Next, a dielectric layer 102 and a stop layer 104 may be formed on the substrate 100. A material of the dielectric layer 102 is, for instance, oxide (e.g., silicon oxide). The stop layer 104 may be formed in the dielectric layer 102. A material of the stop layer 104 may be a conductive material, e.g., doped polysilicon.

After that, a stacked structure SS1 may be formed on the substrate 100. The stacked structure SS1 includes alternately stacked dielectric layers 106 and sacrificial layers 108. In some embodiments, the stacked structure SS1 may be formed on the dielectric layer 102. In some embodiments, a cross-sectional shape of the stacked structure SS1 located in the peripheral region R1 may include a staircase shape. A material of the dielectric layers 106 is, for instance, oxide (e.g., silicon oxide). A material of the sacrificial layers 108 is, for instance, nitride (e.g., silicon nitride). In some embodiments, a method of forming the stacked structure SS1 may include following steps. First, alternately stacked dielectric material layers (not shown) and sacrificial material layers (not shown) may be formed on the dielectric layer 102. A method of forming the dielectric material layers is, for instance, chemical vapor deposition (CVD). A method of forming the sacrificial material layers is, for instance, CVD. The dielectric material layers and the sacrificial material layers may then be patterned to form the dielectric layers 106 and the sacrificial layers 108, thereby forming the stacked structure SS1.

Next, a dielectric layer 110 may be formed on the stacked structure SS1. The dielectric layer 110 may have a single-layered structure or a multi-layered structure. In some embodiments, a material of the dielectric layer 110 is, for instance, oxide (e.g., silicon oxide). In some embodiments, a method of forming the dielectric layer 110 is, for instance, CVD.

Figure 1B:
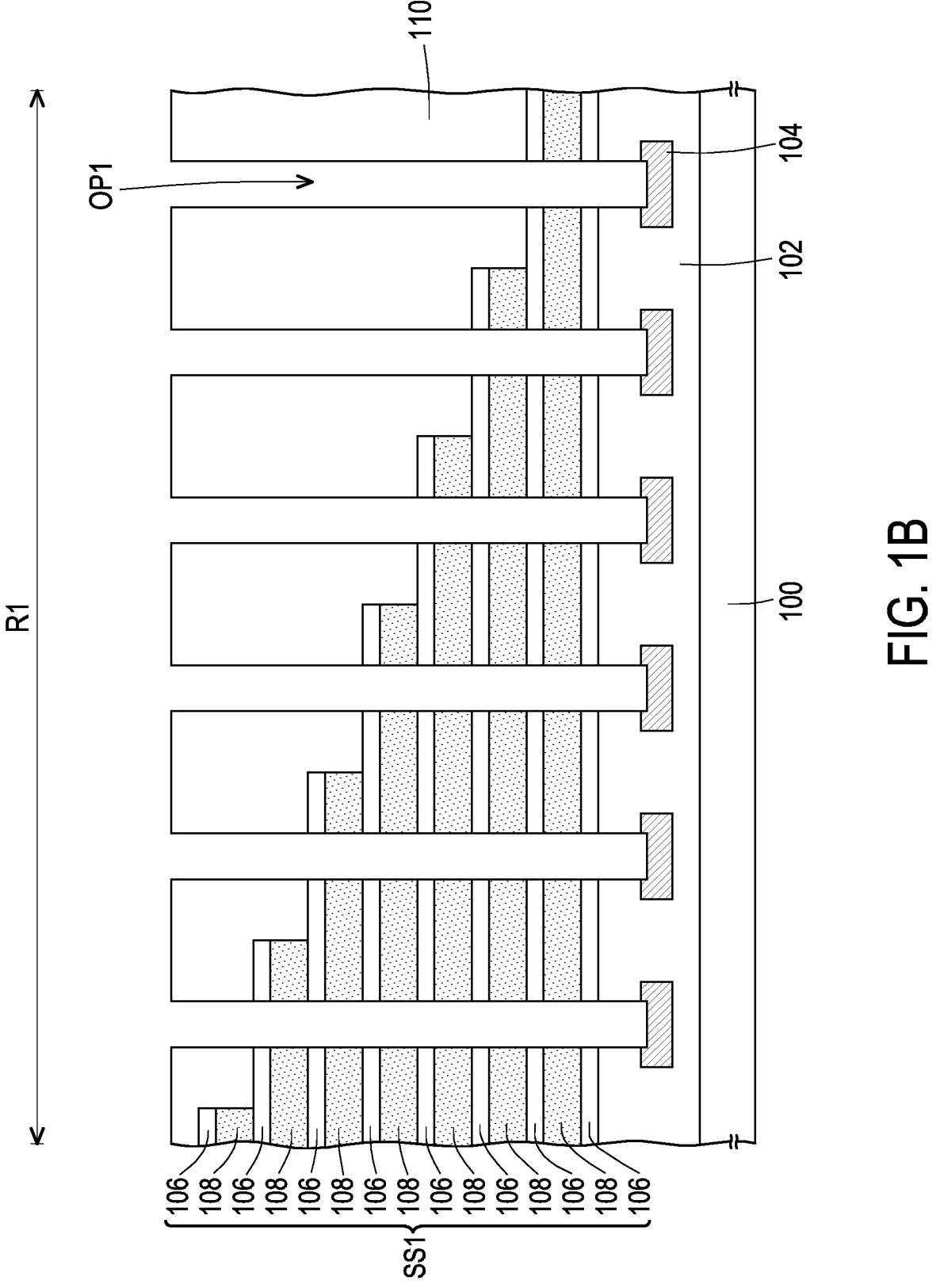

With reference to FIG. 1B, the dielectric layer 110 and the stacked structure SS1 may be patterned to form openings OP1. The openings OP1 pass through the stacked structure SS1 and may expose the stop layer 104. In some embodiments, the dielectric layer 110 and the stacked structure SS1 may be patterned by performing a photolithography process and an etching process (e.g., a dry etching process) to form the openings OP1. The stop layer 104 may serve as an etch stop layer in the etching process for forming the openings OP1.

Figure 1C:
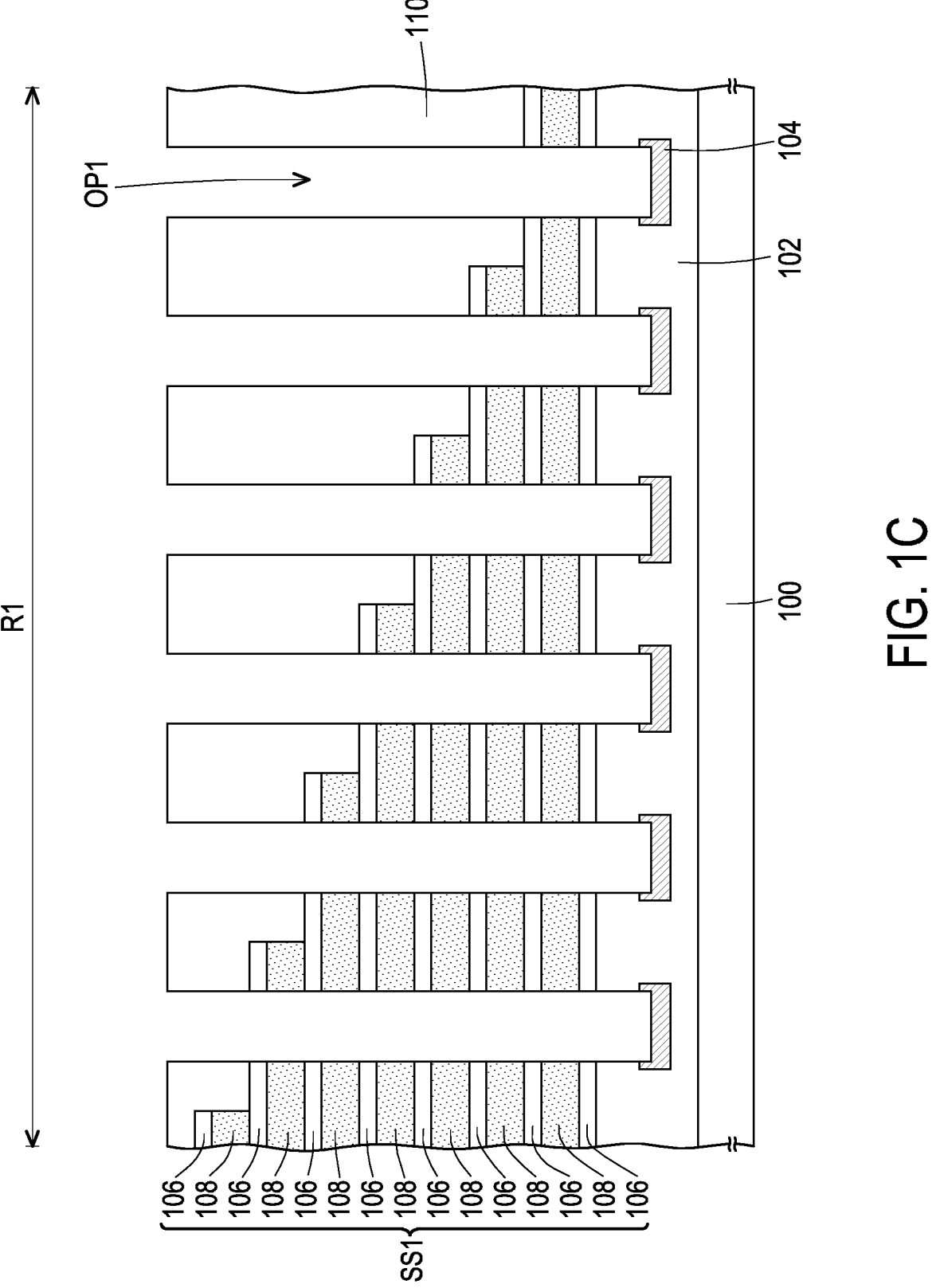

With reference to FIG. 1C, a width of the openings OP1 may be expanded. In some embodiments, a portion of the dielectric layer 110 and a portion of the stacked structure SS1 may be removed by performing a wet etching process, so as to expand the width of the openings OP1.

Figure 1D:
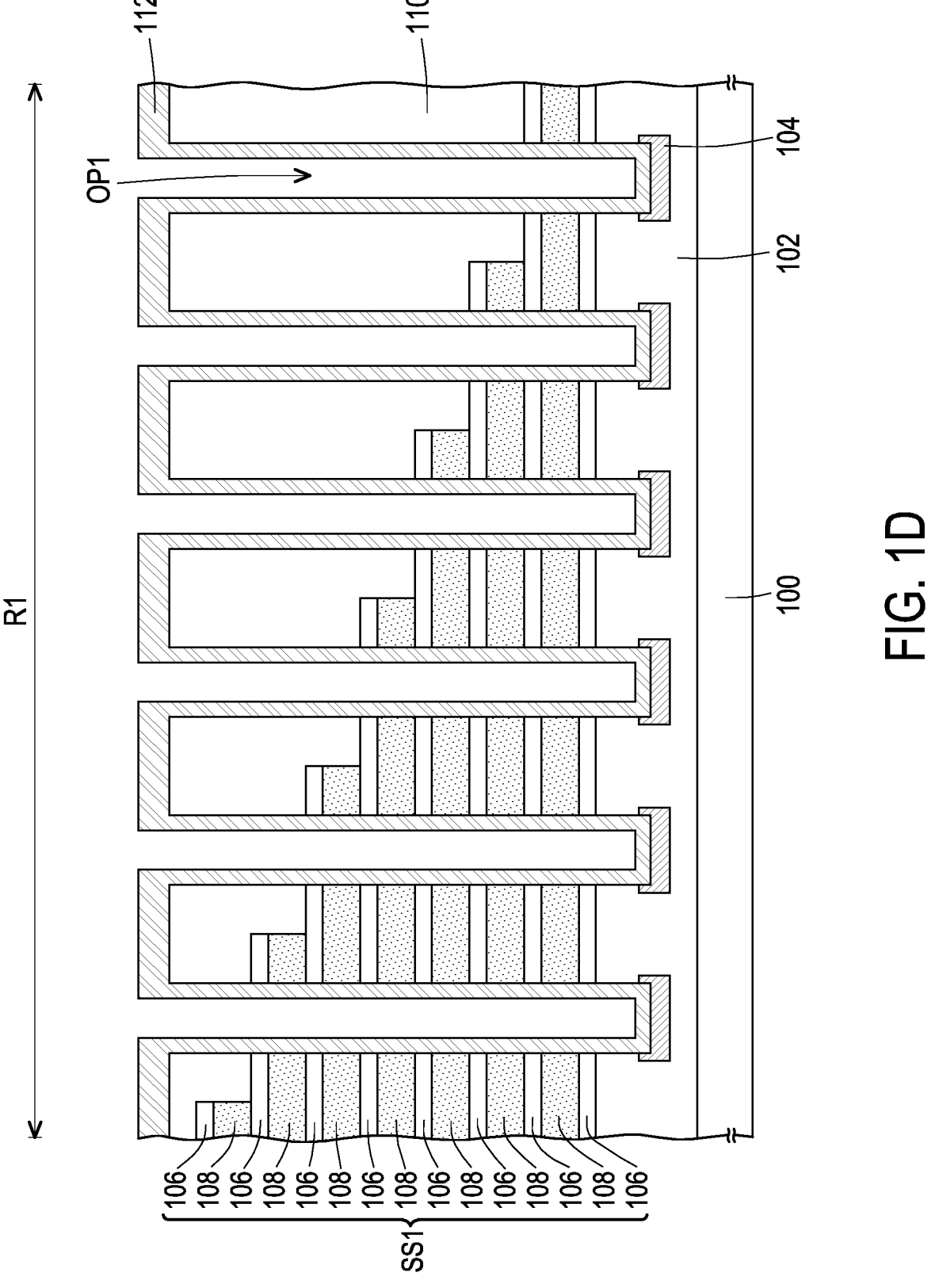

With reference to FIG. 1D, a support material layer 112 may be formed conformally on the dielectric layer 110 and in the openings OP1. A material of the support material layer 112 is, for instance, a conductive material, e.g., doped polysilicon. A method of forming the support material layer 112 is, for instance, CVD.

Figure 1E:
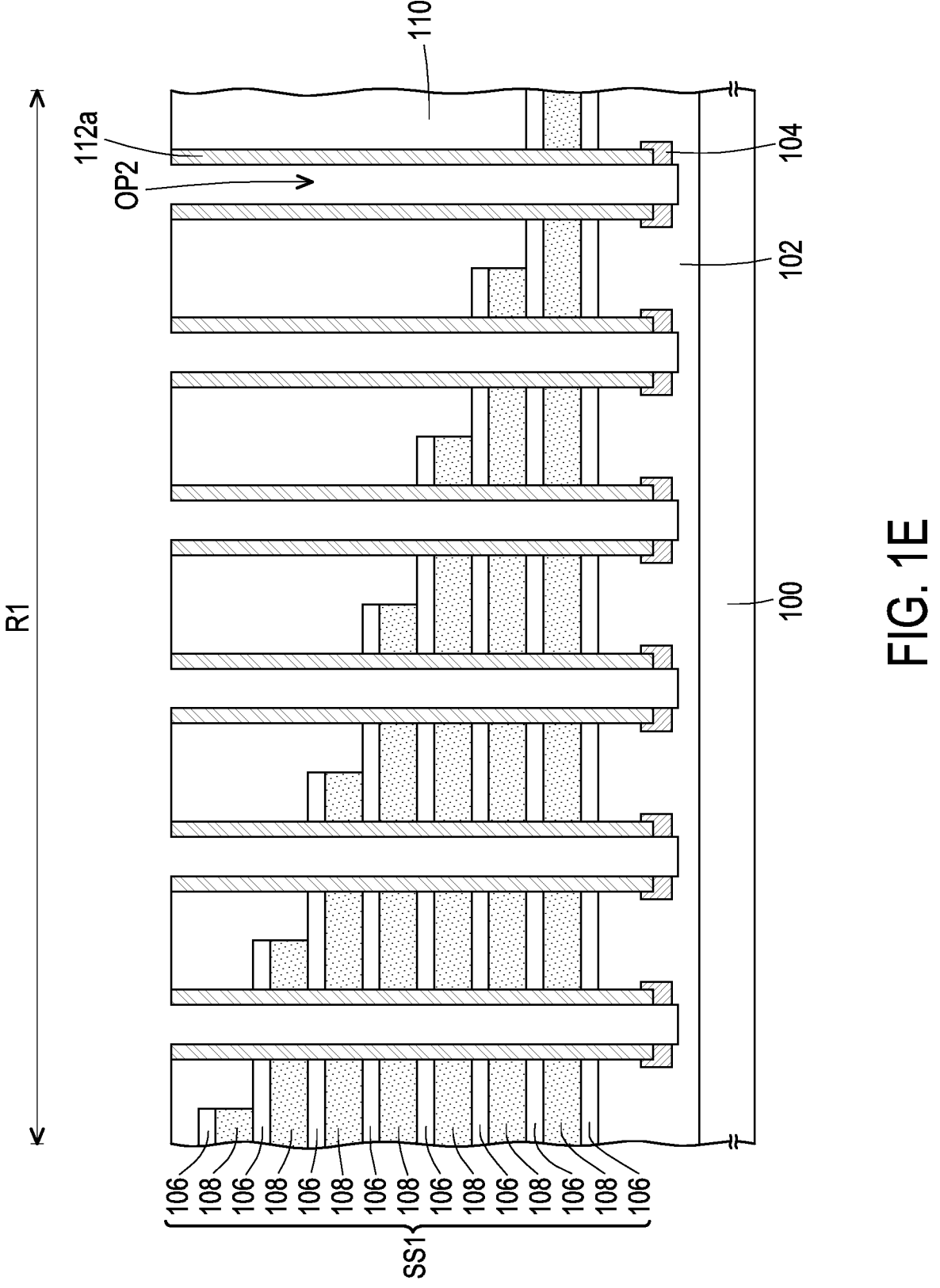

With reference to FIG. 1E, an etch-back process may be performed on the support material layer 112 to form a support pillar 112a. As such, the support pillar 112a may be formed in the peripheral region R1. The support pillar 112a may pass through the stacked structure SS1. In some embodiments, the support pillar 112a may pass through the dielectric layer 110. The support pillar 112a may have an opening OP2 that passes through the support pillar 112a. In some embodiments, a material of support pillar 112a may be a conductive material, e.g., doped polysilicon. In some embodiments, the opening OP2 may expose the stop layer 104. In this embodiment, the etch-back process may be performed to remove a portion of the stop layer 104, whereby the opening OP2 may pass through the stop layer 104. In another embodiment, the etch-back process may be performed to remove a portion of the stop layer 104, whereby the opening OP2 may extend into the stop layer 104 without passing through the stop layer 104. In some embodiments, the etch-back process is, for instance, a dry etching process. In addition, the number of the support pillars 112a is not limited to the number shown in the drawings. As long as the number of the support pillar 112a is at least one, it falls within the scope of protection provided in disclosure.

Figure 1F:
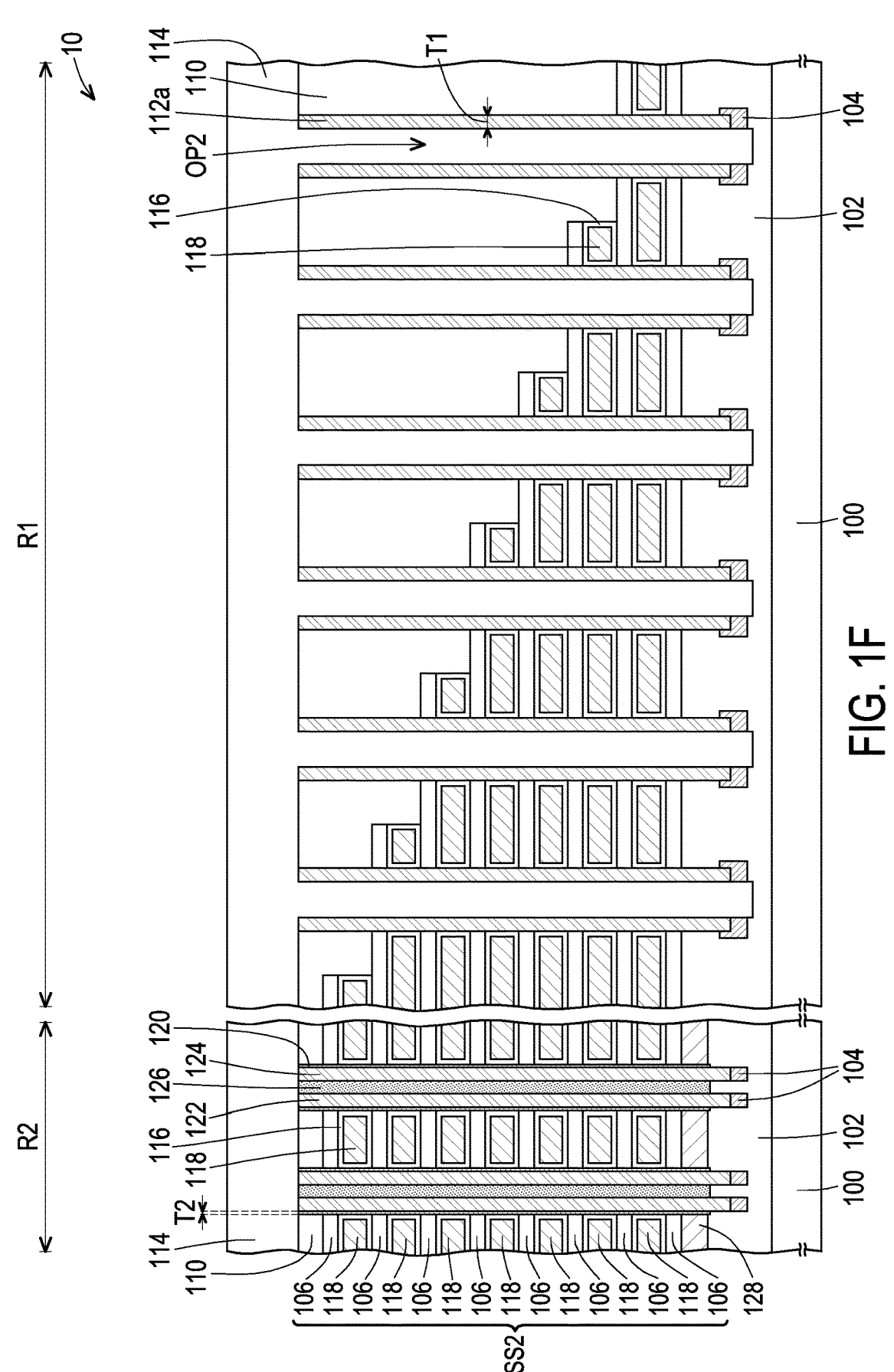

With reference to FIG. 1F, a filling layer 114 filling the opening OP2 may be formed. In some embodiments, the filling layer 114 may be formed on the dielectric layer 110. In some embodiments, a material of the filling layer 114 does not include nitride. The material of the filling layer 114 is, for instance, oxide (e.g., silicon oxide). In some embodiments, the material of the filling layer 114 may be high quality oxide (HQQ). A method of forming the filling layer 114 is, for instance, CVD, e.g., high density plasma chemical vapor deposition (HDPCVD).

After that, a replacement process may be performed to form charge storage structures 116 and conductive layers 118 to replace the sacrificial layers 108. Thereby, a stacked structure SS2 may be formed on the substrate 100. The stacked structure SS2 may include alternately stacked dielectric layers 106 and conductive layers 118. In addition, the number of the dielectric layers 106 and the number of the conductive layers 118 are not limited to those shown in the drawings. As long as the number of the dielectric layers 106 is plural and the number of the conductive layers 118 is plural, it falls within the scope of protection provided in the disclosure. The support pillar 112a passes through the stacked structure SS2. In the peripheral region R1, each of the charge storage structures 116 may be located between the corresponding conductive layer 118 and the support pillar 112a. In addition, the charge storage structures 116 may be located between the conductive layers 118 and the dielectric layers 106. In some embodiments, each charge storage structure 116 may be a composite layer of a nitrogen layer/an oxide layer (NO) or a composite layer of an oxide layer/a nitride layer/an oxide layer (ONO), which should however not be construed as a limitation in the disclosure. A material of the conductive layers 118 is, for instance, a conductive material, e.g., tungsten. In addition, the above-mentioned replacement process is a manufacturing process well known to those skilled in the pertinent art, and thus the relevant description is omitted hereinafter.

In addition, the substrate 100 further includes an array region R2. A channel pillar 120 is formed in the array region R2. The channel pillar 120 passes through the stacked structure SS2. In some embodiments, the channel pillar 120 may pass through the dielectric layer 110. A thickness T1 of the support pillar 112a is greater than a thickness T2 of the channel pillar 120. In the array region R2, each charge storage structure 116 is located between the corresponding conductive layer 118 and the channel pillar 120. A material of the channel pillar 120 may be a semiconductor material, e.g., undoped polysilicon. In addition, the number of the channel pillars 120 is not limited to the number shown in the drawings. As long as the number of the channel pillar 120 is at least one, it falls within the scope of protection provided in the disclosure.

In some embodiments, a conductive pillar 122 and a conductive pillar 124 may be formed. The conductive pillar 122 and the conductive pillar 124 are located in the channel pillar 120, and are separated from each other. In some embodiments, the conductive pillar 122 may serve as a source pillar, and the conductive pillar 124 may serve as a drain pillar. In another embodiment, the conductive pillar 122 may serve as a drain pillar, and the conductive pillar 124 may serve as a source pillar. A material of the conductive pillar 122 and a material of the conductive pillar 124 are, for instance, doped polysilicon. In some embodiments, the support pillar 112a, the conductive pillar 122, and the conductive pillar 124 may be simultaneously formed by the same manufacturing process.

In some embodiments, an isolation pillar 126 may be formed. The isolation pillar 126 is located between the conductive pillar 122 and the conductive pillar 124. Hence, the conductive pillar 122 and the conductive pillar 124 may be isolated from each other by the isolation pillar 126. A material of the isolation pillar 126 is, for instance, a dielectric material, e.g., silicon nitride.

In some embodiments, a stop layer 128 may be formed in the array region R2. The stop layer 128 is located between the stacked structure SS2 and the dielectric layer 102. A material of the stop layer 110 may be a conductive material, e.g., doped polysilicon.

The semiconductor structure 10 provided in the above-mentioned embodiments will be described with reference to FIG. 1F. In addition, although the method of forming the semiconductor structure 10 is exemplified by the above-mentioned method, this should however not be construed as a limitation in the disclosure.

With reference to FIG. 1F, the semiconductor structure 10 includes the substrate 100, the stacked structure SS2, the support pillar 112a, and the channel pillar 120. In some embodiments, the semiconductor structure 10 may be a three-dimensional (3D) NOR flash memory structure or a three-dimensional (3D) AND flash memory structure. The substrate 100 includes the peripheral region R1 and the array region R2.

The stacked structure SS2 is located on the substrate 100. The stacked structure SS2 may include the dielectric layers 106 and the conductive layers 118 that are alternately stacked. In some embodiments, the cross-sectional shape of the stacked structure SS2 located in the peripheral region R1 may include a staircase shape.

The support pillar 112a is located in the peripheral region R1. The support pillar 112a passes through the stacked structure SS2. In some embodiments, the support pillar 112a may pass through the dielectric layer 110. The support pillar 112 may have an opening OP2 that passes through the support pillar 112a. In this embodiment, a material of the support pillar 112a may be doped polysilicon, which should however not be construed as a limitation in the disclosure.

The channel pillar 120 is located in the array region R2. The channel pillar 120 passes through the stacked structure SS2. In some embodiments, the channel pillar 120 may pass through the dielectric layer 110. The thickness T1 of the support pillar 112a is greater than the thickness T2 of the channel pillar 120. In some embodiments, the thickness T1 of the support pillar 112a may be 8 times to 15 times the thickness T2 of the channel pillar 120. In some embodiments, the thickness T1 of the support pillar 112a may be 10 times to 12 times the thickness T2 of the channel pillar 120.

The semiconductor structure 10 may include the filling layer 114. The filling layer 114 may fill the opening OP2. In some embodiments, the filling layer 114 may be located on the dielectric layer 110. In this embodiment, the filling layer 114 may include a single-layered structure, which should however not be construed as a limitation in the disclosure. In some embodiments, the material of the filling layer 114 does not include nitride. In some embodiments, the material of the filling layer 114 is, for instance, oxide (e.g., silicon oxide). In some embodiments, the material of the filling layer 114 may be HQO.

The semiconductor structure 10 may further include the dielectric layer 102 and the stop layer 104. The dielectric layer 102 is located between the stacked structure SS2 and the substrate 100. The stop layer 104 is located in the dielectric layer 102. In some embodiments, the support pillar 112a may be connected to the stop layer 104. In this embodiment, the opening OP2 may pass through the stop layer 104. In other embodiments, the opening OP2 may extend into the stop layer 104 but does not pass through the stop layer 104.

The semiconductor structure 10 may further include the charge storage structures 116, the conductive pillar 122, and the conductive pillar 124. In the array region R2, each charge storage structure 116 is located between the corresponding conductive layer 118 and the channel pillar 120.

The conductive pillar 122 and the conductive pillar 124 are located in the channel pillar 120 and are separated from each other. The conductive pillar 122 and the conductive pillar 124 may be connected to the channel pillar 120. In some embodiments, the conductive pillar 122 and the conductive pillar 124 may be respectively connected to the corresponding stop layer 104. The channel pillar 120 may be located between the conductive pillar 122 and the charge storage structures 116 and between the conductive pillar 124 and the charge storage structures 116.

The semiconductor structure 10 may further include the isolation pillar 126. The isolation pillar 126 is located between the conductive pillar 122 and the conductive pillar 124. The semiconductor structure 10 may further include the stop layer 128. The stop layer 128 is located in the array region R2. The stop layer 128 is located between the stacked structure SS2 and the dielectric layer 102. In some embodiments, the channel pillar 120 may pass through the stop layer 128.

In addition, the detailed content of each component in the semiconductor structure 10 (such as the material, the forming method, etc.) has been described in detail in the above embodiments and thus will not be further explained hereinafter.

It may be derived from the previous embodiments that in the semiconductor structure 10 and the manufacturing method thereof, the semiconductor structure 10 has the support pillar 112a, and the thickness T1 of the support pillar 112a is greater than the thickness T2 of the channel pillar 120. Hence, the structural strength may be enhanced by the support pillar 112a, so that the manufacturing process of the semiconductor structure 10 may be performed smoothly. In addition, since the semiconductor structure 10 has the support pillar 112a, the subsequent etching process of forming the opening for accommodating the TAV may be performed in a self-aligned manner.

Figure 2:
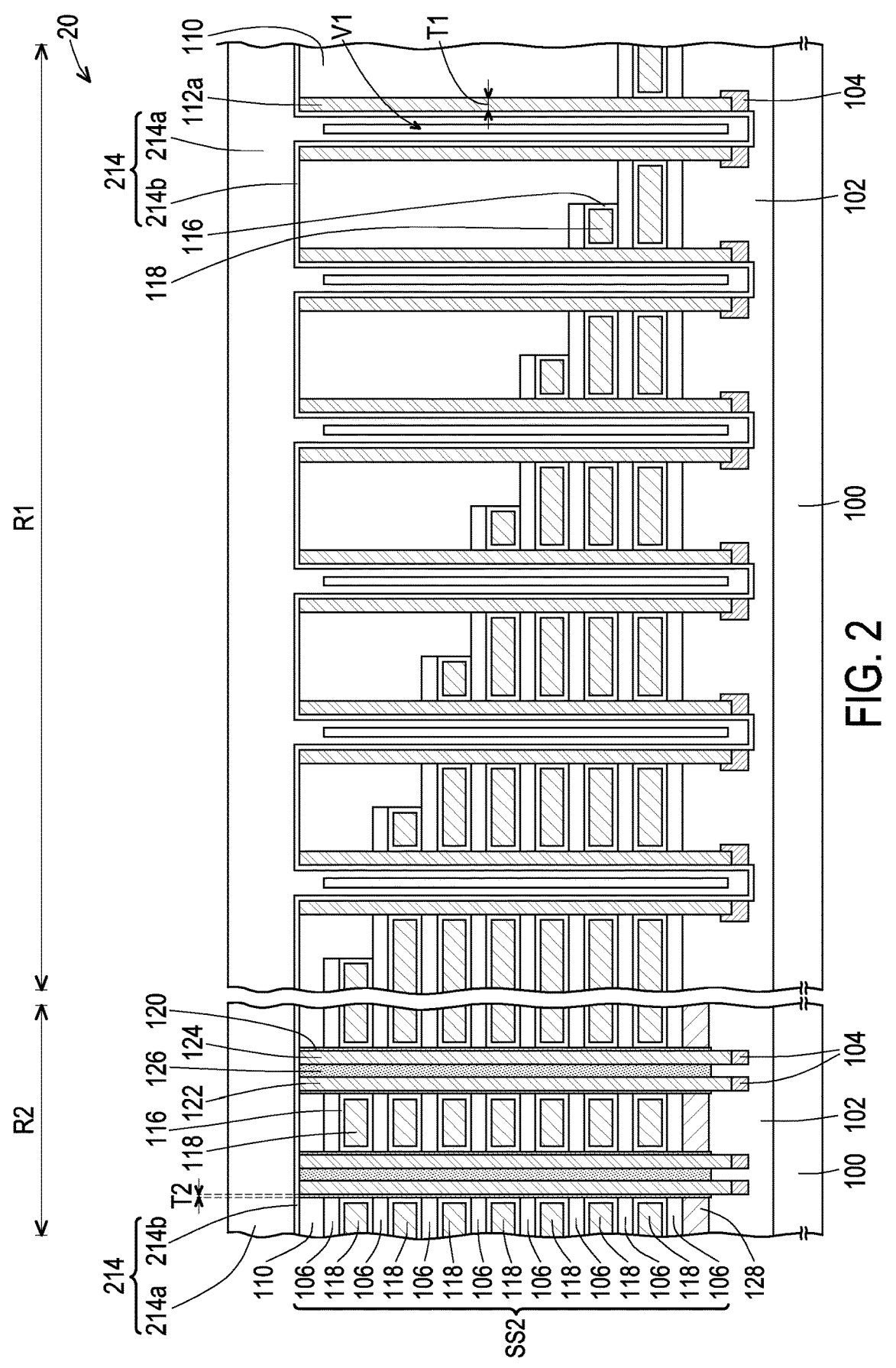
FIG. 2 is a cross-sectional view of a semiconductor structure according to some embodiments of the disclosure.

FIG. 2 is a cross-sectional view of a semiconductor structure according to some embodiments of the disclosure.

With reference to FIG. 1F and FIG. 2, the differences between the semiconductor structure 20 shown in FIG. 2 and the semiconductor structure 10 depicted in FIG. 1F are described below. In the semiconductor structure 20, the opening OP2 may be filled with a filling layer 214, and a portion of the filling layer 214 located in the opening OP2 may have a void V1. In addition, the void V1 is conducive to performing the subsequent etching process of forming the opening for accommodating the TAV in a self-aligned manner.

In this embodiment, the filling layer 214 may include a multi-layered structure. For instance, the filling layer 214 may include a filling layer 214a and a filling layer 214b. The filling layer 214a is located on the dielectric layer 110 and fills the opening OP2. The filling layer 214a may have the void V1. A material of the filling layer 214a is, for instance, oxide (e.g., silicon oxide). A method of forming the filling layer 214a is, for instance, CVD, e.g., HDPCVD. The filling layer 214b is located between the filling layer 214a and the support pillar 112a. In some embodiments, the filling layer 214b may further be located between the filling layer 214a and the dielectric layer 110. A material of the filling layer 214b is, for instance, oxide (e.g., silicon oxide). In some embodiments, the material of the filling layer 214b may be HQO. A method of forming the filling layer 214b is, for instance, CVD, e.g., HDPCVD. In other embodiments, the filling layer 214b may be omitted, and the filling layer 214 may include a single-layered structure.

In addition, in the semiconductor structure 10 shown in FIG. IF and the semiconductor structure 20 depicted in FIG. 2, the same components are denoted by the same reference numbers, and the relevant description is omitted hereinafter.

It may be derived from the previous embodiments that in the semiconductor structure 20 and the manufacturing method thereof, the semiconductor structure 20 has the support pillar 112a, and the thickness T1 of the support pillar 112a is greater than the thickness T2 of the channel pillar 120. Hence, the structural strength may be enhanced by the support pillar 112a, so that the manufacturing process of the semiconductor structure 20 may be performed smoothly. In addition, since the semiconductor structure 20 has the support pillar 112a, the subsequent etching process of forming the opening for accommodating the TAV may be performed in a self-aligned manner.

FIG. 3A to FIG. 3E are cross-sectional views of a manufacturing process of a semiconductor structure according to other embodiments of the disclosure.

Figure 3A:
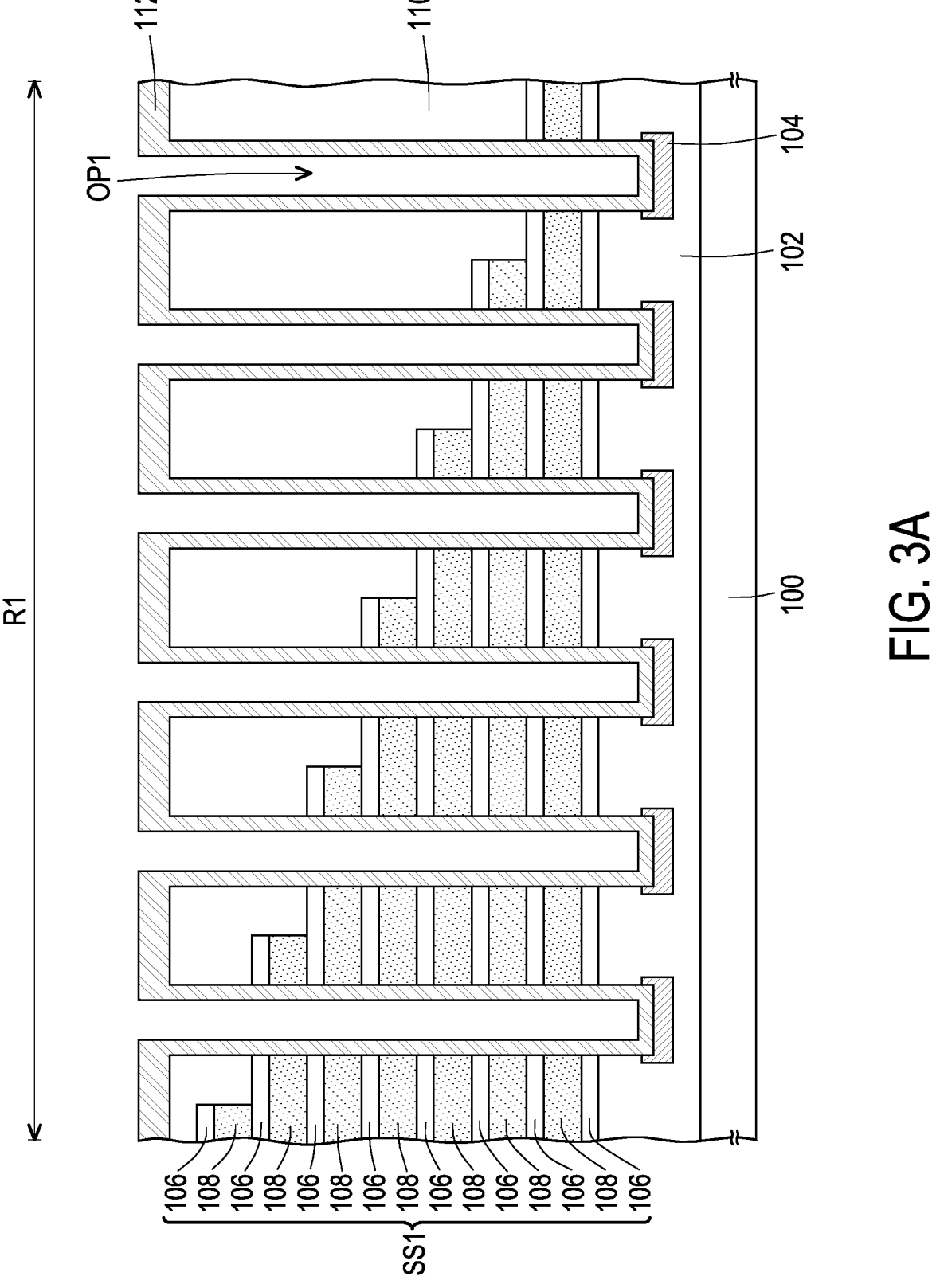
FIG. 3A to FIG. 3E are cross-sectional views of a manufacturing process of a semiconductor structure according to other embodiments of the disclosure.

With reference to FIG. 3A, the structure shown in FIG. 1D is provided. In addition, the detailed content of each component in the semiconductor structure shown in FIG. 1D (such as the material, the configuration manner, the forming method, etc.) has been described in detail in the above embodiment and thus will not be further explained hereinafter.

Figure 3B:
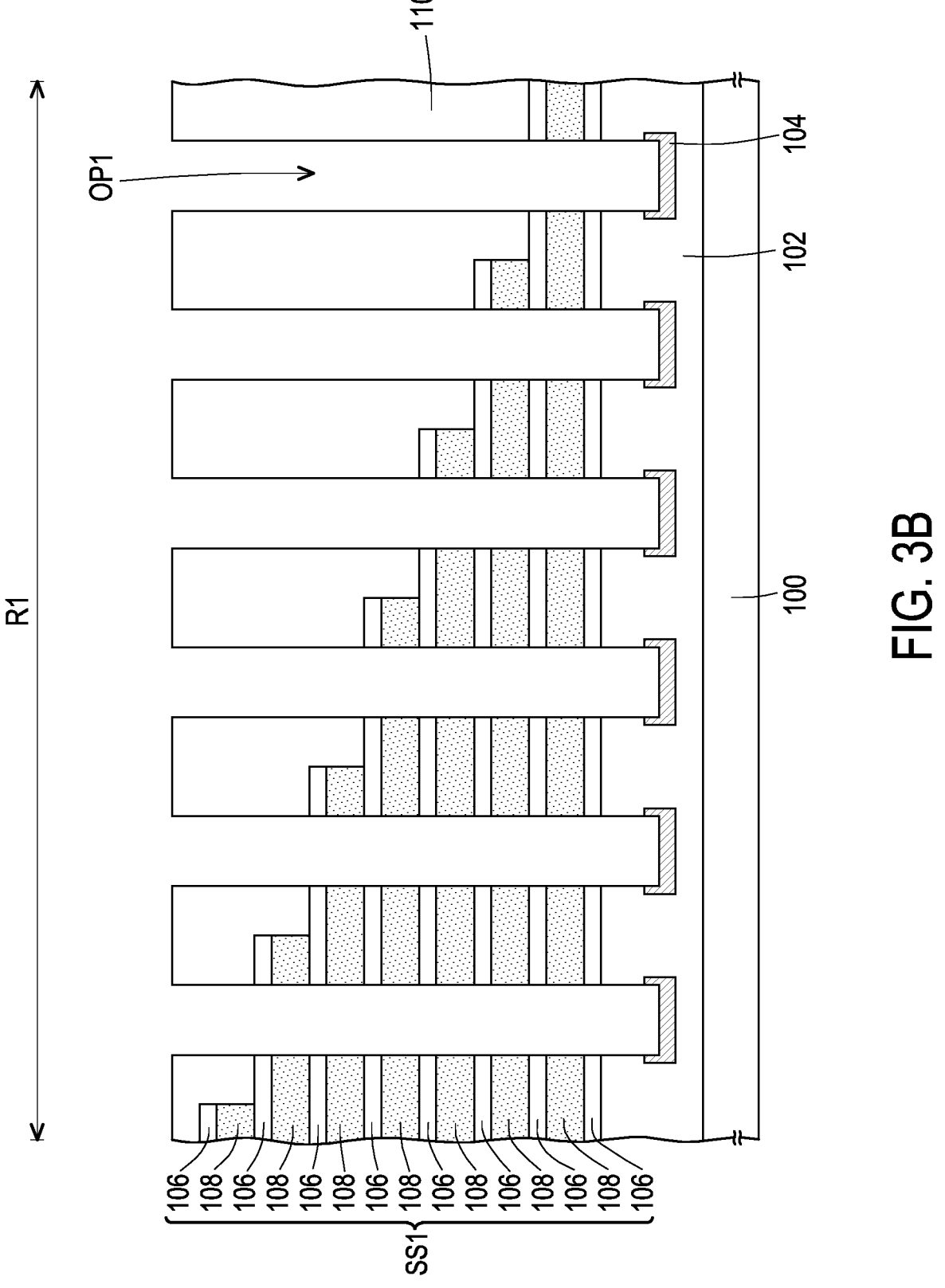

With reference to FIG. 3B, the support material layer 112 may be removed. A method of removing the support material layer 112 is, for instance, a wet etching method.

Figure 3C:
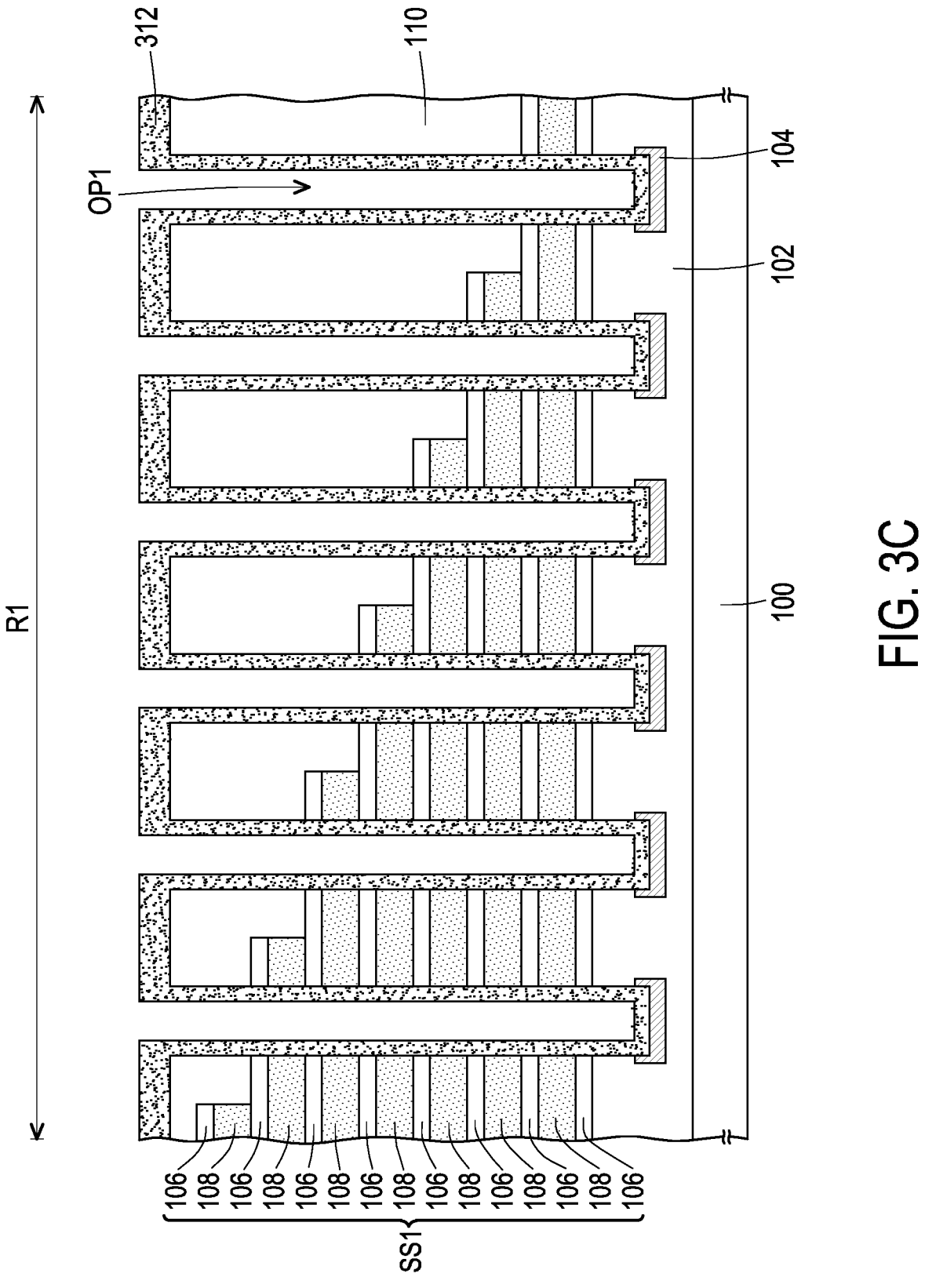

With reference to FIG. 3C, a support material layer 312 may be formed conformally on the dielectric layer 110 and in the openings OP1. A material of the support material layer 312 is, for instance, a dielectric material, e.g., silicon nitride, or a semiconductor material, e.g., undoped polysilicon. A method of forming the support material layer 312 is, for instance, CVD.

In this embodiment, the support material layer 112 may be removed first, and then the support material layer 312 is formed, which should however not be construed as a limitation in the disclosure. In other embodiments, the step of forming the support material layer 112 may be omitted. That is, in other embodiments, after the openings OP1 are formed, the step of forming the support material layer 312 conformally on the dielectric layer 110 and in the openings OP1 may be directly performed.

Figure 3D:
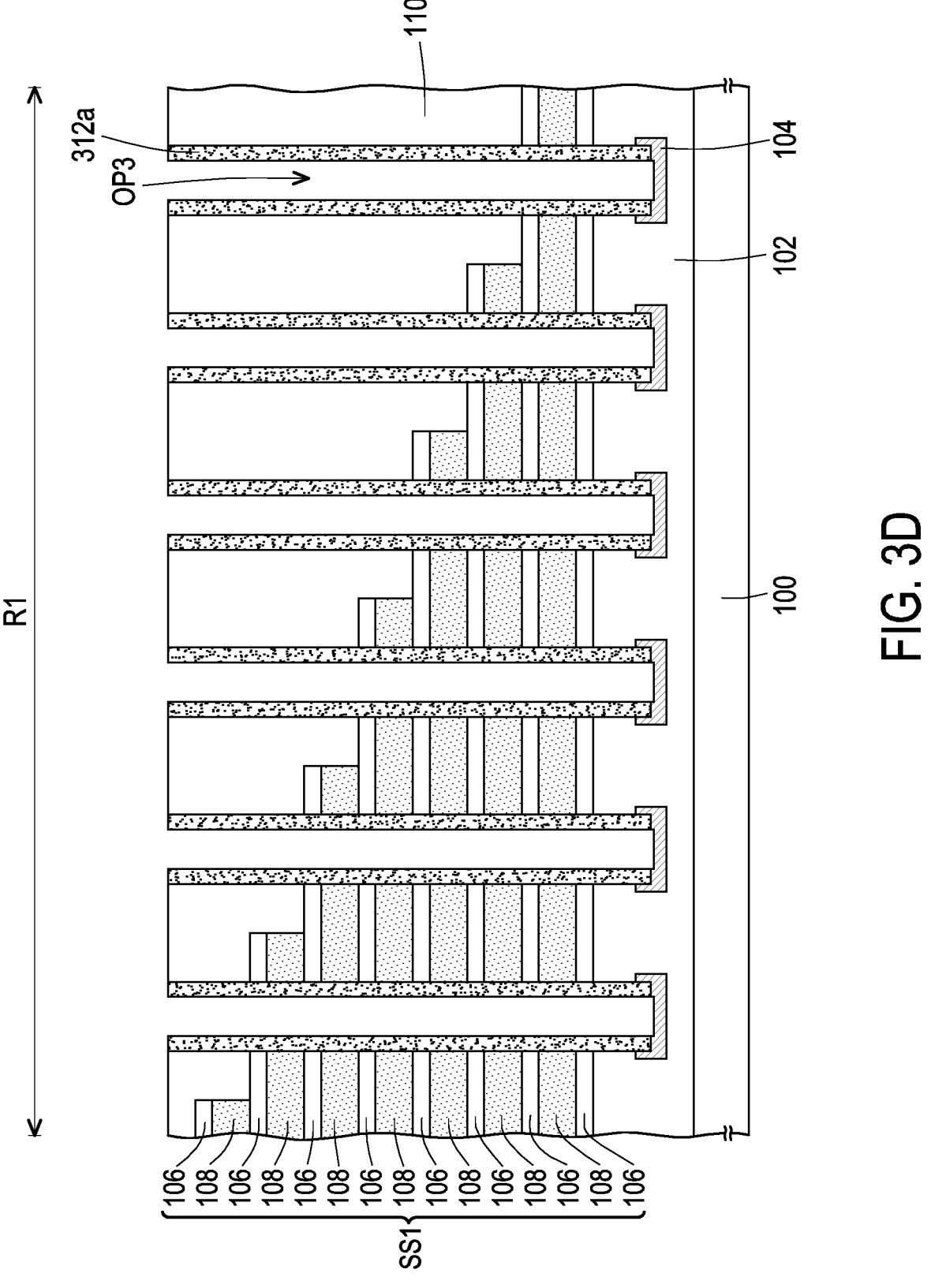

With reference to FIG. 3D, an etch-back process may be performed on the support material layer 312 to form a support pillar 312a. As such, the support pillar 312a may be formed in the peripheral region R1. The support pillar 312a may pass through the stacked structure SS1. In some embodiments, the support pillar 312a may pass through the dielectric layer 110. The support pillar 312a may have an opening OP3 that passes through the support pillar 312a. In some embodiments, a material of the supporting pillar 312a is, for instance, a dielectric material, e.g., silicon nitride, or a semiconductor material, e.g., undoped polysilicon. In some embodiments, the support pillar 312a may expose the stop layer 104. In this embodiment, the etch-back process may be performed to remove a portion of the stop layer 104, whereby the opening OP3 may extend into the stop layer 104 without passing through the stop layer 104. In other embodiments, the etch-back process may be performed to remove a portion of the stop layer 104, whereby the opening OP3 may pass through the stop layer 104. In some embodiments, the etch-back process is, for instance, a dry etching process.

Figure 3E:
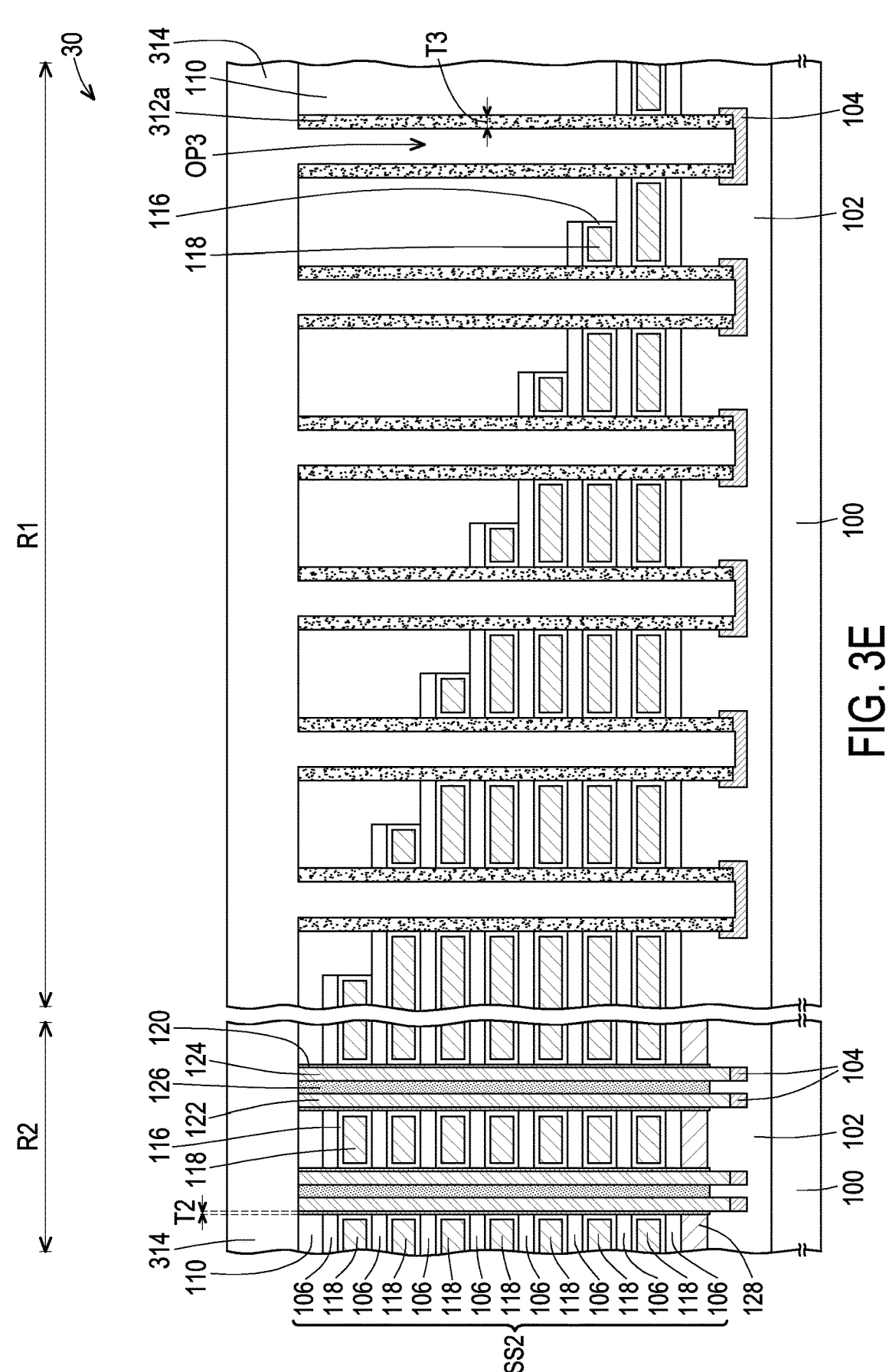

With reference to FIG. 3E, the step described in FIG. IF may be performed to obtain a semiconductor structure 30 shown in FIG. 3E. As such, a filling layer 314 filling the opening OP3 may be formed. In some embodiments, a material of the filling layer 314 does not include nitride. In this embodiment, the filling layer 314 may be the filling layer 114 shown in FIG. 1F, which should however not be construed as a limitation in the disclosure. In other embodiments, the filling layer 314 may be the filling layer 214 which is shown in FIG. 2 and has the void V1. In addition, in the semiconductor structure 10 shown in FIG. 1F and the semiconductor structure 30 depicted in FIG. 3E, the same components are denoted by the same reference numbers, and the relevant description is omitted hereinafter.

The semiconductor structure 30 provided in the previous embodiments is described below with reference to FIG. 3E. In addition, although the method of forming the semiconductor structure 30 is exemplified by the above-mentioned method, this should however not be construed as a limitation in the disclosure.

With reference to FIG. IF and FIG. 3E, the differences between the semiconductor structure 30 shown in FIG. 3 and the semiconductor structure 10 depicted in FIG. 1F are described below. In the semiconductor structure 30, the support pillar 312a passes through the stacked structure SS2, and the material of the support pillar 312a may be a dielectric material, e.g., silicon nitride, or a semiconductor material e.g., undoped polysilicon. A thickness T3 of the support pillar 312a is greater than the thickness T2 of the channel pillar 120. In some embodiments, the thickness T3 of the support pillar 312a may be 8 times to 15 times the thickness T2 of the channel pillar 120. In some embodiments, the thickness T3 of the support pillar 312a may be 10 times to 12 times the thickness T2 of the channel pillar 120. The filling layer 314 may fill the opening OP3. In some embodiments, a material of the filling layer 314 does not include nitride.

It may be derived from the previous embodiments that in the semiconductor structure 30 and the manufacturing method thereof, the semiconductor structure 30 has the support pillar 312a, and the thickness T3 of the support pillar 312a is greater than the thickness T2 of the channel pillar 120. Hence, the structural strength may be enhanced by the support pillar 312a, so that the manufacturing process of the semiconductor structure 30 may be performed smoothly. In addition, since the semiconductor structure 30 has the support pillar 312a, the subsequent etching process of forming the opening for accommodating the TAV may be performed in a self-aligned manner.

To sum up, in the semiconductor structure and the manufacturing method thereof provided in one or more embodiments of the disclosure, the semiconductor structure has the support pillar, and the thickness of the support pillar is greater than the thickness of the channel pillar. Hence, the support pillar may serve to enhance the structural strength, which allows the manufacturing process of the semiconductor structure to be smoothly performed. Besides, owing to the support pillar of the semiconductor structure, the subsequent etching process of forming the opening for accommodating the TAV may be performed in a self-aligned manner.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor structure, comprising:
   a substrate, comprising a peripheral region and an array region;
   a stacked structure, located on the substrate;
   a support pillar, located in the peripheral region and passing through the stacked structure; and
   a channel pillar, located in the array region and passing through the stacked structure, wherein a thickness of the support pillar is greater than a thickness of the channel pillar, and
   the thickness of the support pillar is 8 times to 15 times the thickness of the channel pillar.

2. The semiconductor structure according to claim 1, wherein a cross-sectional shape of the stacked structure located in the peripheral region comprises a staircase shape.

3. The semiconductor structure according to claim 1, wherein a material of the support pillar comprises doped polysilicon, silicon nitride, or undoped polysilicon.

4. The semiconductor structure according to claim 1, wherein the support pillar has an opening passing through the support pillar.

5. The semiconductor structure according to claim 4, further comprising:
   a filling layer, filling the opening.

6. The semiconductor structure according to claim 5, wherein a material of the filling layer does not include nitride.

7. The semiconductor structure according to claim 5, wherein the filling layer comprises a single-layered structure.

8. The semiconductor structure according to claim 5, wherein the filling layer comprises a multi-layered structure.

9. The semiconductor structure according to claim 5, wherein a portion of the filling layer located in the opening has a void.

10. The semiconductor structure according to claim 4, further comprising:
   a dielectric layer, located between the stacked structure and the substrate; and
   a stop layer, located in the dielectric layer.

11. The semiconductor structure according to claim 10, wherein the opening passes through the stop layer.

12. The semiconductor structure according to claim 10, wherein the opening extends into the stop layer but does not pass through the stop layer.

13. The semiconductor structure according to claim 1, wherein the stacked structure comprises alternately stacked dielectric layers and conductive layers, and the semiconductor structure further comprises:
   charge storage structures, wherein each of the charge storage structures is located between a corresponding conductive layer of the conductive layers and the channel pillar; and
   a first conductive pillar and a second conductive pillar, located in the channel pillar and separated from each other.

14. A manufacturing method of a semiconductor structure, comprising:
   providing a substrate, wherein the substrate comprises a peripheral region and an array region;
   forming a stacked structure on the substrate;
   forming a support pillar in the peripheral region, wherein the support pillar passes through the stacked structure; and
   forming a channel pillar in the array region, wherein the channel pillar passes through the stacked structure, a thickness of the support pillar is greater than a thickness of the channel pillar, and the thickness of the support pillar is 8 times to 15 times the thickness of the channel pillar.

15. The manufacturing method of the semiconductor structure according to claim 14, wherein the support pillar has an opening passing through the support pillar.

16. The manufacturing method of the semiconductor structure according to claim 15, further comprising:

forming a filling layer filling the opening.

17. The manufacturing method of the semiconductor structure according to claim 16, wherein a material of the filling layer does not include nitride.

18. The manufacturing method of the semiconductor structure according to claim 14, wherein the stacked structure comprises alternately stacked dielectric layers and conductive layers, and the manufacturing method of the semiconductor structure further comprises:

forming charge storage structures, wherein each of the charge storage structures is located between a corresponding conductive layer of the conductive layers and the channel pillar; and forming a first conductive pillar and a second conductive pillar, wherein the first conductive pillar and the second conductive pillar are located in the channel pillar and separated from each other.

19. The manufacturing method of the semiconductor structure according to claim 18, wherein the support pillar, the first conductive pillar, and the second conductive pillar are simultaneously formed by a same manufacturing process.

*    *    *    *    *